(12) United States Patent
Lee

(10) Patent No.: US 8,188,420 B2
(45) Date of Patent: May 29, 2012

(54) HIGH RESOLUTION OPTICAL ENCODER SYSTEMS HAVING A SET OF LIGHT DETECTING ELEMENTS EACH COMPRISING A PAIR OF COMPLEMENTARY DETECTORS (AS AMENDED)

(75) Inventor: Wei Yan Lee, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 403 days.

(21) Appl. No.: 12/618,710

(22) Filed: Nov. 14, 2009

(65) Prior Publication Data
US 2011/0114829 A1     May 19, 2011

(51) Int. Cl.
*G01D 5/34*     (2006.01)
(52) U.S. Cl. ............................ 250/231.13; 250/231.16
(58) Field of Classification Search ............ 250/231.13–231.18, 221, 239, 250/216; 341/11, 13
See application file for complete search history.

(56) References Cited

U.S. PATENT DOCUMENTS

| | | | |
|---|---|---|---|
| 5,929,789 | A | 7/1999 | Barbehenn |
| 6,124,589 | A | 9/2000 | West |
| 7,265,339 | B1 | 9/2007 | Ng et al. |
| 8,097,842 | B2 * | 1/2012 | Thor et al. ............... 250/231.13 |
| 2007/0120049 | A1 | 5/2007 | Wong et al. |

FOREIGN PATENT DOCUMENTS

| | | |
|---|---|---|
| WO | WO2007/087351 A2 | 8/2007 |
| WO | WO2008/074998 A1 | 6/2008 |

* cited by examiner

*Primary Examiner* — Que T Le

(57) ABSTRACT

Disclosed are various embodiments of front-end analog circuitry for use in conjunction with optical encoders. Highly accurate analog output signals are provided by front-end analog circuitry in incremental or absolute motion encoders to interpolation circuitry, which is capable of providing high interpolation factor output signals having high timing accuracy. The disclosed interpolation circuits may be implemented using CMOS or BiCMOS processes without undue effort.

24 Claims, 13 Drawing Sheets

HIGH RESOLUTION OPTICAL ENCODER SYSTEMS HAVING A SET OF LIGHT DETECTING ELEMENTS EACH COMPRISING A PAIR OF COMPLEMENTARY DETECTORS (AS AMENDED)

FIELD OF THE INVENTION

Various embodiments of the inventions described herein relate to the field of motion encoders, and interpolation circuitry, components, devices, systems and methods associated therewith.

BACKGROUND

Interpolation circuitry is commonly employed in incremental and absolute digital motion encoding systems, where the interpolation circuitry is configured to generate digital pulses having higher frequencies than base sinusoidal analog signals input to the circuitry. As the interpolation factor of the circuitry increases, the accuracy of the interpolation circuitry becomes ever more critical since the output provided by such circuitry ultimately determines the accuracy of the encoding system. Unfortunately, due to the architecture of most interpolation circuitry—which typically relies on a large number of comparators—the outputs provided by interpolation circuitry tend to be noisy and contain undesired noise spikes arising from excessive switching in the comparators. As a result, the comparators employed in interpolation circuitry for motion encoders typically employ a significant amount of hysteresis to provide immunity from noise spikes. The hysteresis itself can become a source of inaccuracy for the interpolation circuitry, however, especially at high interpolation factors.

Referring to FIG. 1, there is shown an optical encoder system 10 of the prior art comprising light emitter 20 (typically an LED), code wheel or code strip 30 having apertures 31a-31f disposed therein, and light detector 40 comprising photodiodes 41a (A) and 41b (A\). In optical encoder 10, collimated light beam 22 emitted by light emitter 20 projects light onto code wheel 30. Collimated light beam 22 is interrupted by masked or optically opaque sections disposed between apertures 31a-31f as code wheel or code strip 30 rotates in first direction 111 or in second direction 112. (Note that code wheel or code strip 30 rotates substantially in a plane defined approximately by collimated light beam 22 as it is projected from light emitter 20 towards light detector 40.) Portions 50a and 50b of collimated light beam 22 project through apertures 31c and 31d and sweep across light detector 40 and photodiodes 41b (A\) and 41a (A) as code wheel or code strip 30 rotates in direction 111 or 112 in the plane. As code wheel 30 moves in direction 111 or 112, the light patterns projected onto first vertical portion 70 of light detector 40 by beam portions 50a and 50b change, and the output signals provided by photodiodes 41a and 41b change correspondingly. These output signals are generally employed to generate a pair of quasi-triangular signals (as shown, for example, in FIG. 2), which are then used to determine any one or more of the position, speed and direction of code disk 30.

Referring now to FIG. 2, there are shown "triangular" signals A and A\, which are compared to one another and employed to generate pulse 109 using circuitry and methods well known to those skilled in the art of optical encoders. Typically, another set of photodetectors B and B\ is also provided, where photodetectors B and B\ are positioned 90 degrees out of phase with respect to photodetectors A and A\, and which are employed to generate another pulse (not shown in FIG. 2). Pulses for photodetectors A and A\, and B and B\, are generated which are 90 degrees out of phase with respect to one another. As shown in FIG. 2, pseudo-triangular signals A and A\, which for purposes of subsequent interpolation processing would optimally be linear or straight between maximum and minimum portions thereof, exhibit curved portions near the tops and bottoms thereof. These curved portions are due to undesirable capacitance effects, and complicate considerably any subsequent attempts at interpolation.

In an encoder of the type shown in FIG. 1, the spatial resolution of device 10 is generally determined and set according to the specific requirements of the end user. More particularly, the distances or spacing between adjoining photodetectors A and A\ (41a and 41b, respectively), are typically determined according to the particular requirements of a given customer or end user. Time and effort are required to implement such requirements, especially in respect of wafer fabrication when an unusual or new spatial resolution for device 10 is required.

One technique employed in the prior art to change or adjust the spatial resolution provided by device 10 is to employ one or more reticles disposed between light emitter 20 and light detector 40. FIG. 3 shows one such arrangement, where reticle strip 60 has reticles 61 and 62 disposed therein. Reticles 61 and 62 are configured to interfere with the light beams impinging thereon, and to modify them so that the pattern of light projected on light detectors 40 is changed. Reticles 61 and 62 are specifically configured to provide the degree, amount and type of spatial resolution desired of encoder 10.

FIG. 4 shows one example of output signals provided by two different sets of reticles having different sizes. The large semi-sinusoidal output signals to the left of FIG. 4 are generated using large reticles 61-65 (i.e., large solid line rectangles), while the small semi-sinusoidal signals on the right of FIG. 4 are generated using small reticles (i.e., small dashed line rectangles disposed inside large reticles 61 through 65). It will be seen that the smaller reticles provide output signals having increased spatial resolution than those generated using the larger reticles. Reticle sizes can be changed according to the spatial resolution requirements for encoder 10, which is preferably configured to have photodiodes of a common size. The spatial resolution of encoder 10 is then determined by changing reticle size so long as reticle size is smaller then the photodiodes being employed. One disadvantage of the use of reticles in optical encoders is that additional high-precision optical components are required, and the cost of the resulting encoder increases accordingly.

Continuing to refer to FIG. 4, it will be seen that the large and small "sinusoidal" signals are somewhat distorted and not truly sinusoidal, and thus are difficult to use as a basis for interpolation in processing circuitry such as an integrated circuit ("IC") or digital signal processing ("DSP") IC.

It will now be seen that conventional methods used in some analog incremental optical encoders rely on an additional reticle or mask being placed over the photodetectors to act as a light modulation filter to generate approximately sinusoidal output signals. The shape and structure of the reticle or mask must generally be custom-optimized to produce nearly sinusoidal waveforms. Reticle design can become quite complex, especially at low line counts. Accurate alignment and positioning of the reticle or mask is also necessary, which typically manifests itself as a major drawback in manufacturing and assembly.

Another commonly-employed technique in the prior art for providing increased resolution interpolated output signals from an optical encoder system is to reduce the amplitude of the input signals systematically. The reduced amplitude signals are then compared to reference signals through XOR operations to generate interpolated bits. See, for example, U.S. Pat. No. 6,355,927 to Snyder entitled "Interpolation Methods and Circuits for Increasing the Resolution of Optical Encoders" One disadvantage of such an approach is that the number of comparators must be doubled for every additional bit that is to be interpolated. For example, at 2× interpolation ($2^1$), a minimum of 8 comparators are required, and the number of comparators required beyond that doubles for every $2''$ interpolation that is desired. Thus, in the case where 32× ($2^5$) interpolation is required, 128 comparators will be required. The use of so many comparators increases design and IC costs.

What is needed is interpolation circuitry for motion encoding systems where the spatial resolution of an encoder may be adjusted or manipulated without the use of additional optical components, reticle strips or reticles, and where custom spatial resolutions may be effected quickly and accurately without unduly increasing cost. What is also needed is interpolation circuitry for motion encoding systems having improved immunity from noise, that is capable of providing high interpolation factors, that can provide highly accurate interpolation output signals, and that does not unduly increase circuit complexity, design and/or cost.

SUMMARY

In some embodiments, there is provided an optical encoder comprising a light emitter configured to emit a beam of light therefrom, a code strip or code wheel configured to move along an axis of movement and comprising a plurality of alternating optically opaque and optically transmissive sections disposed along the axis, each of the optically opaque and optically transmissive sections having a width g/2, the optically transmissive sections being spaced apart from one another by a distance g/2, and a light detector comprising a set of light detecting elements, each light detecting element comprising a pair of complementary light detectors arranged substantially parallel to the axis of movement, each light detector in each pair having a width d/2 or d/4, each light detecting element having a width d or 3d/4, the light detecting elements being arranged substantially parallel to the axis of movement, where the light beam shines upon the code strip or code wheel, portions of the light beam project through the optically transmissive sections to sweep across the set of light detecting elements as the code strip or code wheel moves along the axis of movement, g does not equal d, the ratio g/d equals 3M/(3M−1) when g is greater than d, the ratio g/d equals 3M/(3M+1) when g is less than d, and M is an integer.

In other embodiments, there is provided a method of generating a sinusoidal signal with an optical encoder comprising emitting a beam of light from a light emitter, moving a code strip or code wheel along an axis of movement through the beam of light, the code strip or code wheel comprising a plurality of optically transmissive sections disposed along the axis, each optically transmissive section having a width g/2, the optically transmissive sections being spaced apart from one another by a distance g/2, sweeping portions of the light beam projecting through the optically transmissive sections across a set of light detecting elements as the code strip or code wheel moves along the axis of movement, and detecting the portions of the light beam with the set of light detecting elements, each light detecting element comprising a pair of complementary light detectors arranged substantially parallel to the axis of movement, each light detector in each pair having a width d/2 or d/4, each light detecting element having a width d or 3d/4, the light detecting elements being arranged substantially parallel to the axis of movement, where g does not equal d, the ratio g/d equals 3M/(3M−1) when g is greater than d, the ratio g/d equals 3M/(3M+1) when g is less than d, and M is an integer.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

FIG. 2 shows representative output signals A, A\ and a pulse provided by an optical encoder;

The drawings are not necessarily to scale. Like numbers refer to like parts or steps throughout the drawings, unless otherwise noted.

DETAILED DESCRIPTIONS OF SOME PREFERRED EMBODIMENTS

This patent application incorporates by reference U.S. patent application Ser. No. 12/393,162 filed Feb. 26, 2009 entitled "Interpolation Accuracy Improvement in Motion Encoder Systems, Devices and Methods" to Mei Yee Ng et al. and U.S. patent application Ser. No. 12/533,841 filed Jul. 31, 2009 entitled "Interpolation Accuracy Improvement in Motion Encoder Systems, Devices and Methods" to Kheng Hin Toh et al., each in its respective entirety.

Figure 1:
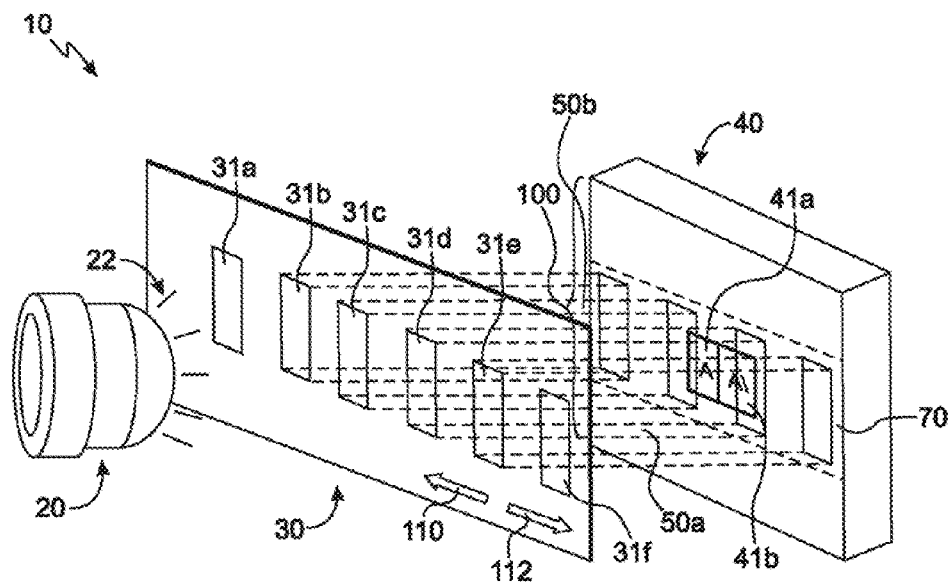
FIG. 1 shows an optical encoder 10 of the prior art.
Figure 2:
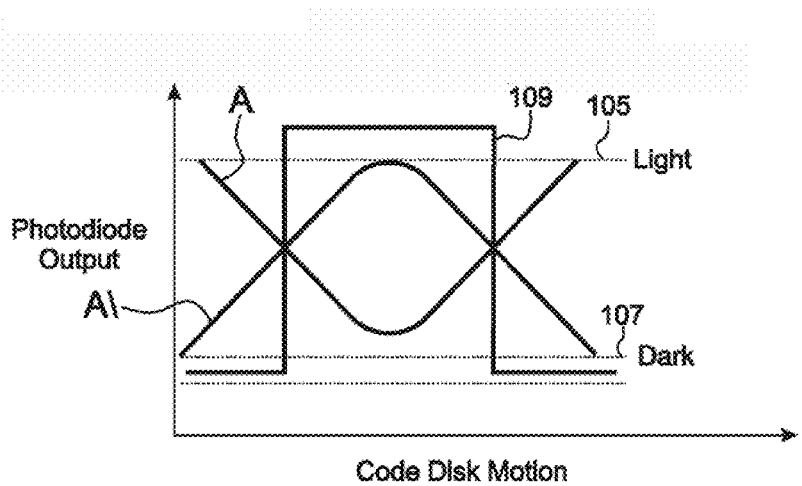
FIG. 2 shows representative output signals A, A\ and a pulse generated in accordance with such output signals.
Figure 3:
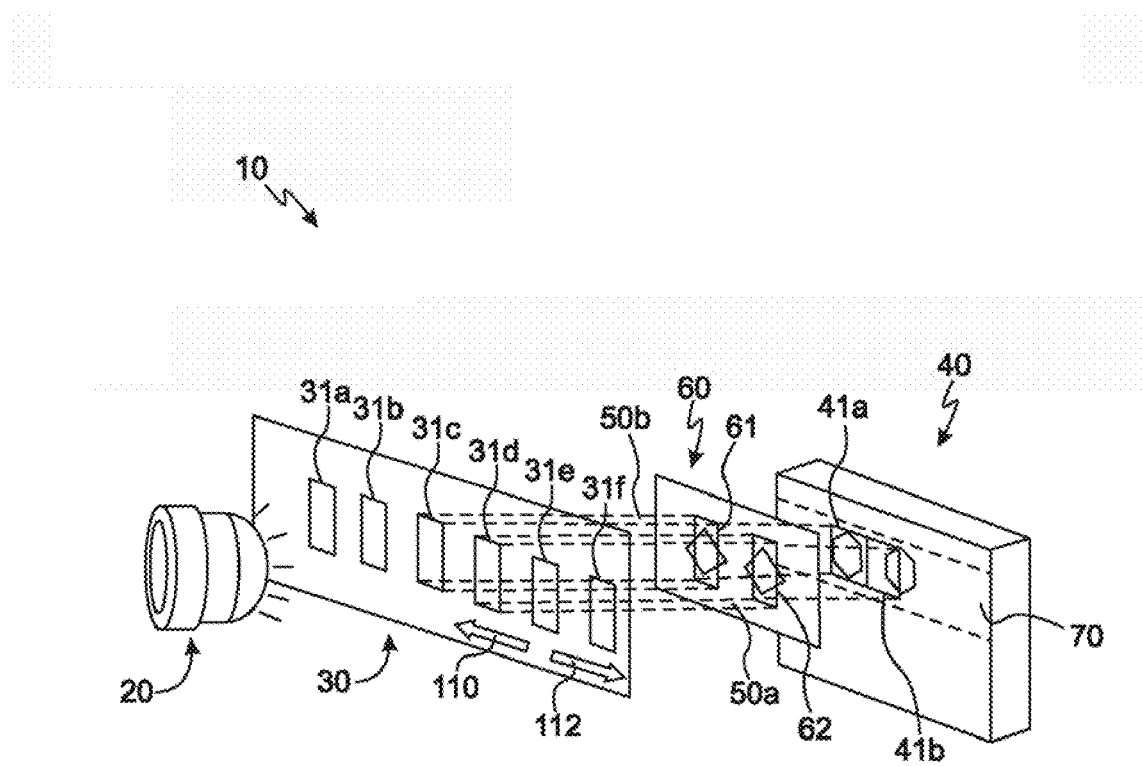
FIG. 3 shows another optical encoder 10 of the prior art.
Figure 4:
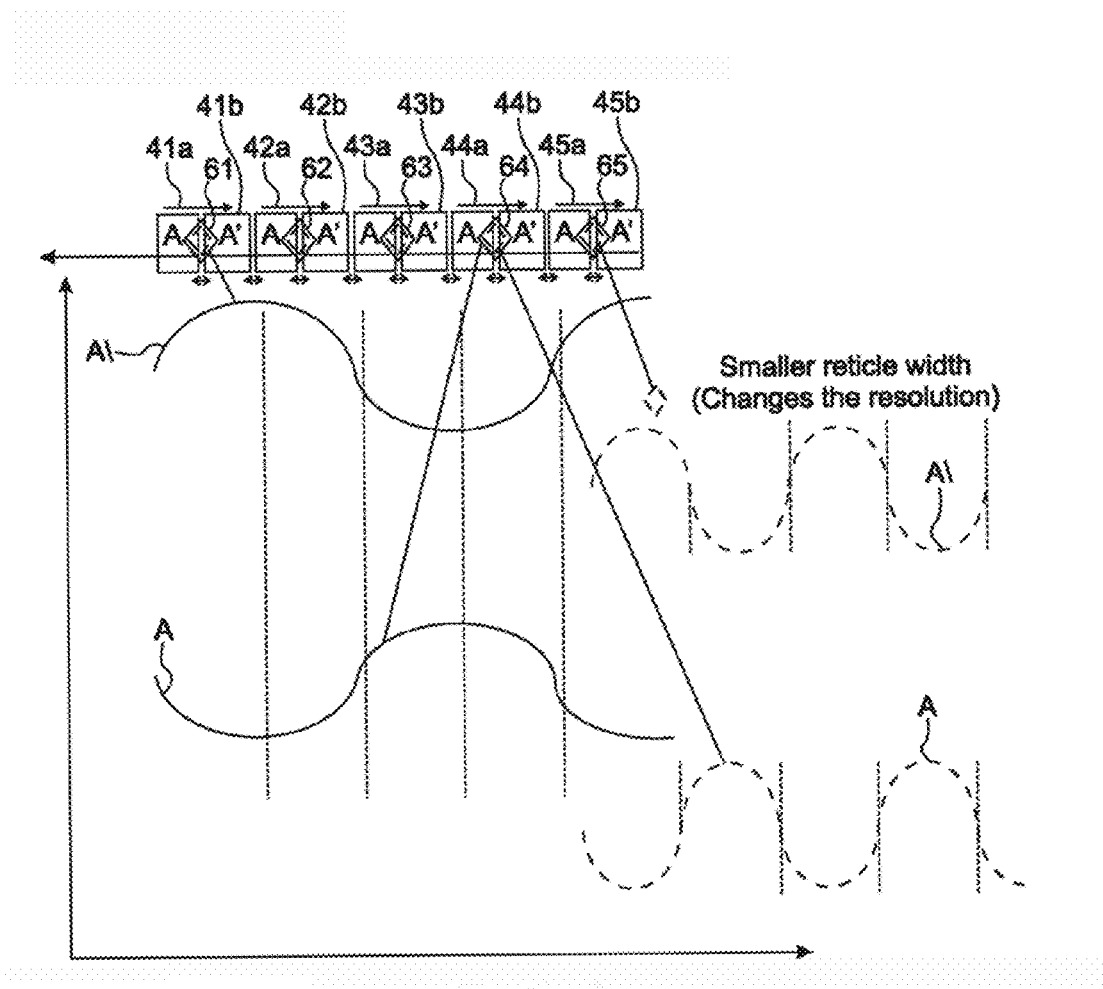
FIG. 4 illustrates how the spatial resolution of an optical encoder may be adjusted through the use of reticles.
Figure 5:
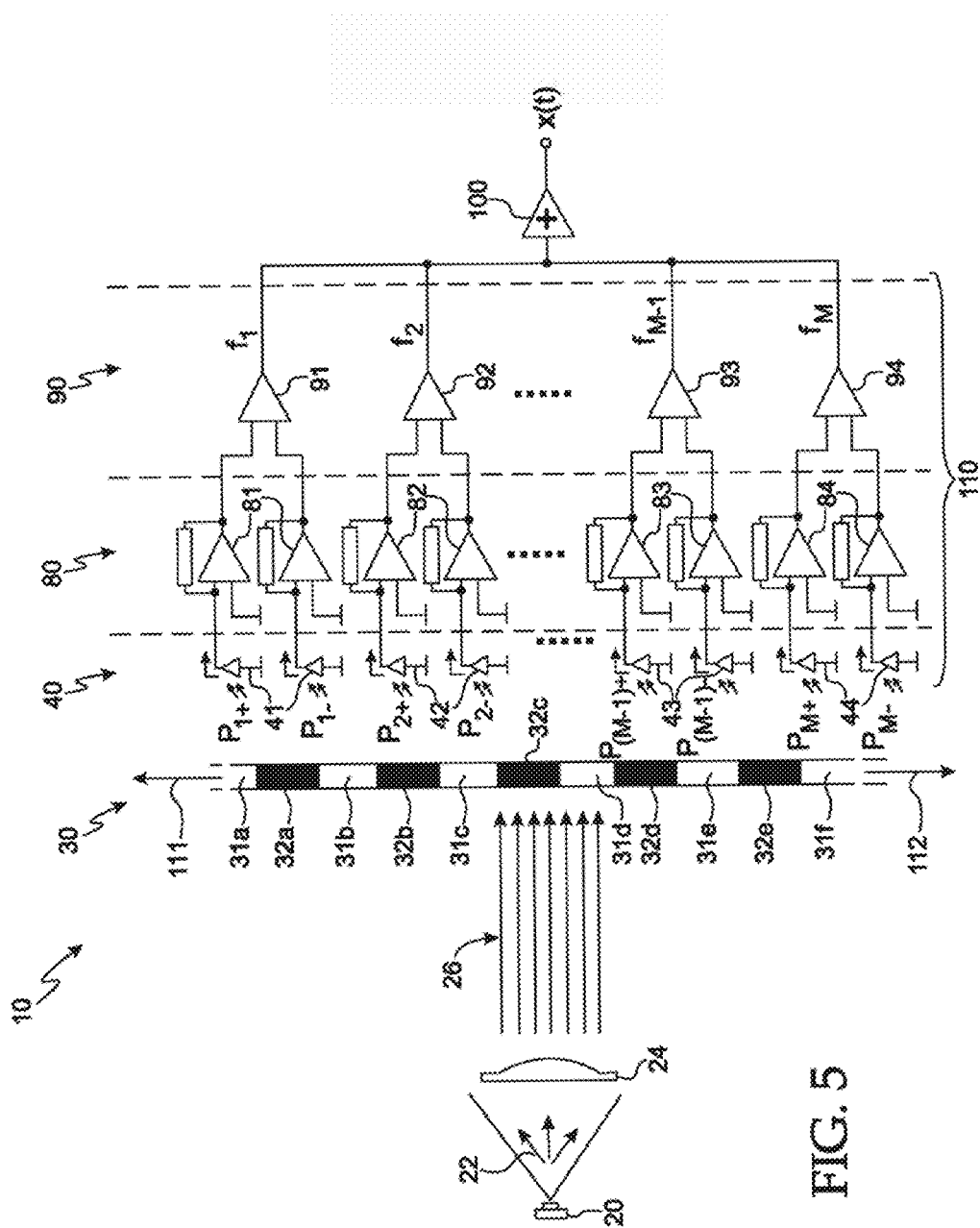
FIG. 5 shows one embodiment of a portion of an optical encoder 10 comprising novel front-end analog circuitry.

Referring now to FIG. 5, there is shown one embodiment of a portion of an optical encoder 10, which comprises light emitter 20 configured to emit a beam of light 22 therefrom. FIG. 5 shows light beam 22 incident on collimating lens 24, which collimates light beam 22 to form collimated light beam 26, which then becomes incident on code strip or code wheel 30 configured to move along an axis coinciding with directions of movement 111 and 112. Note that collimating lens 24 is optional, and according to some embodiments is therefore not required. As shown, code strip or code wheel 30 comprises a plurality of optically transmissive sections 31a through 31f, which alternate with optically opaque sections 32a through 32e disposed in between optically transmissive sections 31a through 31f. Optically transmissive sections 31a through 31f, which in one embodiment are apertures or slits, and optically opaque sections 32a through 32e interposed between optically transmissive sections 31a through 31f, move in direction 111 and/or 112 along the axis. In one embodiment, optically opaque and optically transmissive sections 31a-31f and 32a-32e each have widths equal to g/2, and optically transmissive sections 31a-31f are therefore spaced apart from one another by the same distance g/2. In still further embodiments, optically opaque sections 32a-32e are reflective. Note that various embodiments include transmissive or reflective optical encoders.

Figure 6:
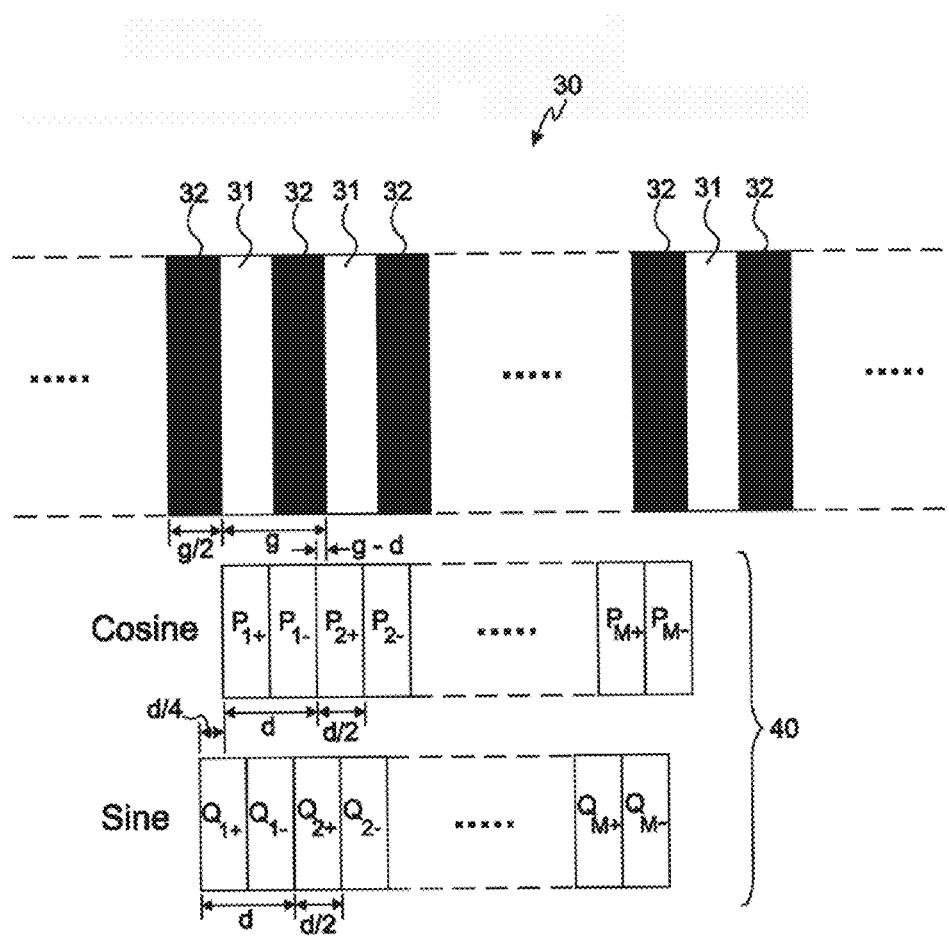
FIG. 6 shows one embodiment of light detectors 40 and code wheel or code strip 30 configured to produce triangular output signals.

Referring now to FIGS. 5 and 6, it will be seen that light detector 40 comprises a set of light detecting elements 41, 42, 43 and 44, where each light detecting element comprises a pair of complementary light detectors $P_{1+}, P_{1-}, \ldots, P_{M+}, P_{M-}$ arranged side-by-side and substantially parallel to the axis of movement. In one embodiment where triangular output signals are provided by differential amplifiers 91, 92, 93 and 94, and as shown in FIG. 6, each of light detectors $P_{1+}, P_{1-}, \ldots, P_{M+}, P_{M-}$ in each pair has a width d/2, and each of light detecting elements 41, 42, 43 and 44 has a width d. Light detecting elements 41, 42, 43 and 44 are arranged side-by-side and substantially parallel to the axis of movement coinciding with directions of movement 111 and 112 of code strip or 1code wheel 30. As further shown in FIG. 5, portions of light beam 26 project through optically transmissive sections 31a-31f to sweep across the sets of light detecting elements 41, 42, 43 and 44 as code strip or code wheel 30 moves along the axis of movement. In a preferred embodiment, the phase shift T between adjoining light detector elements equals $2\pi/3M$.

According to the embodiment illustrated in FIGS. 5 and 6, the distance g does not equal the distance d, the ratio of g/d equals $3M/(3M-1)$ when g is greater than d, the ratio of g/d equals $3M/(3M+1)$ when g is less than d, and M is an integer. In some embodiments, M ranges between 1 and 25. In preferred embodiments M is greater than 7, more about which is said below. The dimensions of the photodetector elements in light detector circuit 40 and code wheel or code strip 30 are shown in FIG. 6, where the code wheel or code strip grating pitch equals g, the photodetector element width equals d, and the separation between sine and cosine channel equals d/4 to yield a phase shift of $\pi/2$.

Referring now to FIG. 5, output signals provided by light detectors 41 ($P_{1+}, P_{1-}$), 42 ($P_{2+}, P_{2-}$), 43 ($P_{(M-1)+}, P_{(M-1)-}$) and 44 ($P_{M+}, P_{M-}$) in each pair of complementary light detectors in light detector circuit 40 are provided to corresponding pairs of first and second amplifiers 81, 82, 83 and 84 in amplifier circuit 80. The respective outputs generated by the first and second amplifiers for each pair of complementary light detectors 81, 82, 83 and 84 are provided to corresponding respective differential amplifiers 91, 92, 93 and 94. Differential amplifiers 91, 92, 93 and 94 combine the differential signals of each of the complementary pairs of light detectors. Moreover, each of differential amplifiers 91, 92, 93 and 94 provides an output signal having a triangular shape. Next, an output cosine signal x(t) is produced by summing amplifier 100 by taking the average output of all the individual elements as follows:

$$x(t)=[f_1+f_2+f_3+\ldots+f_{M-1}+f_M]/M \qquad \text{(eq. 1)}$$

Output signal x(t) is characterized by its very high fidelity, accuracy and low total harmonic distortion ("THD"), and may therefore be used to generate high-resolution interpolated output signals. Thus, the raw signals of a rotary or linear incremental encoder 10 are employed in one embodiment to form triangular waveforms, which in turn are combined using spatial averaging techniques to produce a highly accurate and almost purely sinusoidal output signal having a well-defined waveform morphology, phase, amplitude and frequency.

Note that FIG. 5 illustrates the cosine portion only of encoder 10. Typically, encoder 10 contains both sine and cosine light-detecting circuitry portions that are configured to provide cosine and sine output signals 90 degrees out of phase with respect to one another. See FIG. 6, where both cosine and sine portions of light detector circuit 40 are shown.

Continuing to refer to FIGS. 5 and 6, and as discussed above, light incident on the incremental window and bar patterns of code wheel or code strip 30 is modulated by photodetector elements 41, 42, 43 and 44 and the circuitry associated therewith to provide output signals that are triangularly shaped. To create the effect of a moving average filter, multiple phase shifted copies of a triangular waveform are created by intentionally mismatching the dimensions of the grating pitch and the widths of photodetector elements 41, 42, 43 and 44. Instead of taking the moving average of the signals over time, the signals are averaged spatially across photodetector elements 41, 42, 43 and 44, where each signal has a constant phase shift T with respect to signals generated by adjoining photodetector elements.

Note that the number of apertures or optically transmissive sections 31a-31f, the number of optically opaque sections 32a-32e, and the number of photodetector elements 41, 42, 43 and 44 shown in FIGS. 5 and 6 are merely illustrative. Any suitable number or arrangement of such optical encoder components may be employed according to the particular application and the particular design and cost constraints at hand.

Figure 7:
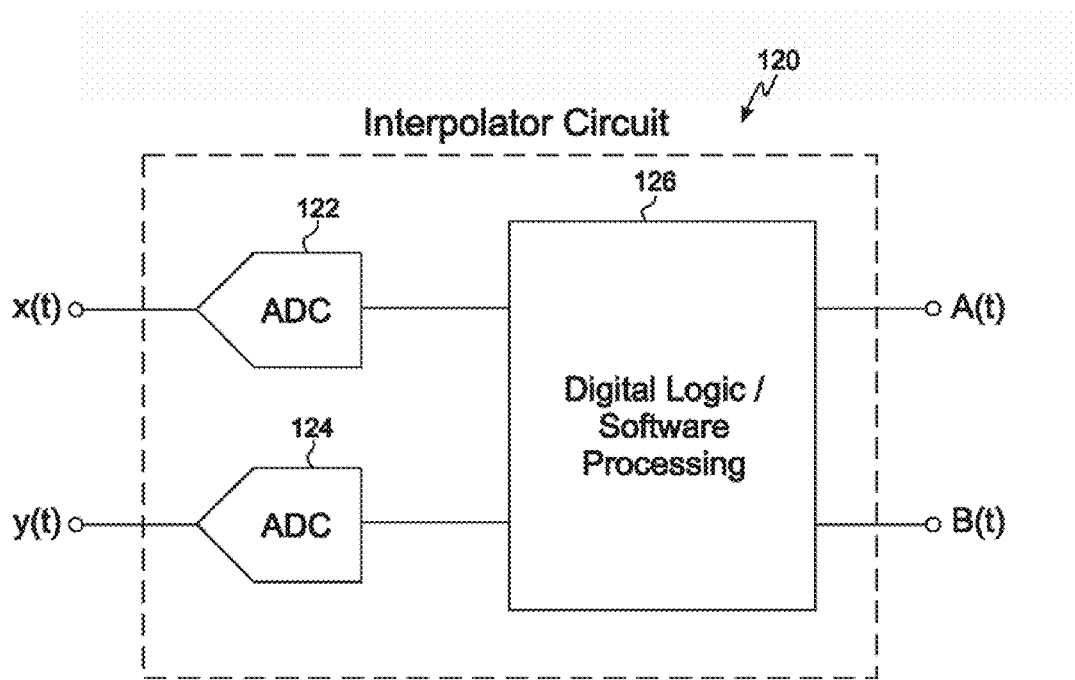
FIG. 7 shows one embodiment of an interpolator circuit 120.
Figure 8:
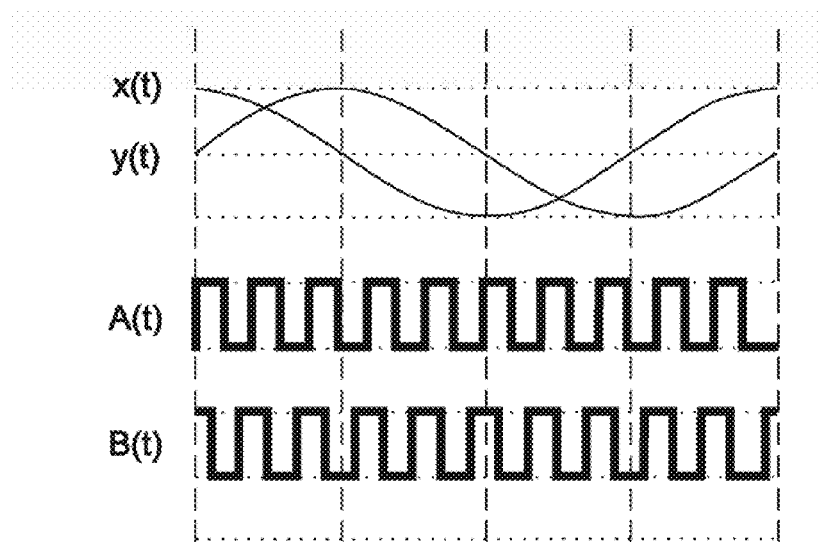
FIG. 8 shows one embodiment of sinusoidal signals x(t) and y(t) provided as inputs to interpolator circuit 120, and outputs A(t) and B(t) provided as outputs therefrom.

FIG. 7 shows a block diagram according to one embodiment where output signals x(t) and y(t) generated by front-end analog circuitry 110 of FIG. 5 are further processed in interpolator circuit 120 to provide outputs A(t) and B(t). Each of input signals x(t) and y(t) is provided to an analog-to-digital converter (ADC) 122 or 124. Digital values corresponding to high-accuracy x(t) and y(t) sinusoidal signals are then provided as inputs to digital logic/software processing circuitry 126, which interpolates the input sinusoidal signals provided thereto to provide interpolated digital output signals A(t) and B(t) as shown, by way of example, in FIG. 8. Output signals A(t) and B(t) typically have a frequency that is some integer multiple of input signals x(t) and y(t), although non-integer outputs can also be generated. Output signals A(t) and B(t) can be configured to assume any suitable waveform morphology, such as square waves, pulses and so on. Data processing circuitry 126 interpolates signals x(t) and y(t) using data processing techniques hardware and software well known to those skilled in the art, and thus need not be further described herein.

The optimal averaging window has been found to be equal to 2π/3, which produces a sinusoidal output signal x(t) or y(t) with the lowest total harmonic distortion (or THD). That is, averaging is done over precisely ⅓ of the signal period, where the phase shift between signals is T=2π/3M. The optimal amount of intentional mismatch between g and d is then determined by the equation:

(Phase shift/Signal period)=(2π/3M)/2π=(g−d)/(g)    (eq. 2)

Thus, the ratio g/d=3M/(3M−1). It is preferred that M be greater than 7 so that a sufficiently large number of photodetectors are employed to provide the degree of smoothing required to generate a precise sinusoidal output signal. As M increases, the resulting sinusoidal output signal has ever lower total harmonic distortion ("THD"). Referring to Table 1 below, it will be seen that THD approaches 0.86% as M approaches infinity. Note that the values of M shown in Table 1 are odd numbers only, which has been done for purposes of symmetry to simplify mathematical analysis. Practically, however, M can assume any integer value.

TABLE 1

Values of M and Associated THD

| Number of photodetector elements, M | Phase shift T = 2π/3M | Ratio, g/d = 3M/(3M − 1) | T.H.D. (%) |
|---|---|---|---|
| 3 | 0.70 | 1.125 | 2.38 |
| 5 | 0.42 | 1.071 | 1.26 |
| 7 | 0.30 | 1.050 | 1.01 |
| 9 | 0.23 | 1.038 | 0.94 |

TABLE 1-continued

Values of M and Associated THD

| Number of photodetector elements, M | Phase shift T = 2π/3M | Ratio, g/d = 3M/(3M − 1) | T.H.D. (%) |
|---|---|---|---|
| 11 | 0.19 | 1.031 | 0.90 |
| 13 | 0.16 | 1.026 | 0.89 |
| 15 | 0.14 | 1.023 | 0.88 |
| 17 | 0.12 | 1.020 | 0.87 |
| 19 | 0.11 | 1.018 | 0.87 |
| 21 | 0.10 | 1.016 | 0.87 |
| 23 | 0.09 | 1.015 | 0.86 |
| 25 | 0.08 | 1.014 | 0.86 |
| ∞ | 0.00 | 1.000 | 0.86 |

Figure 9:
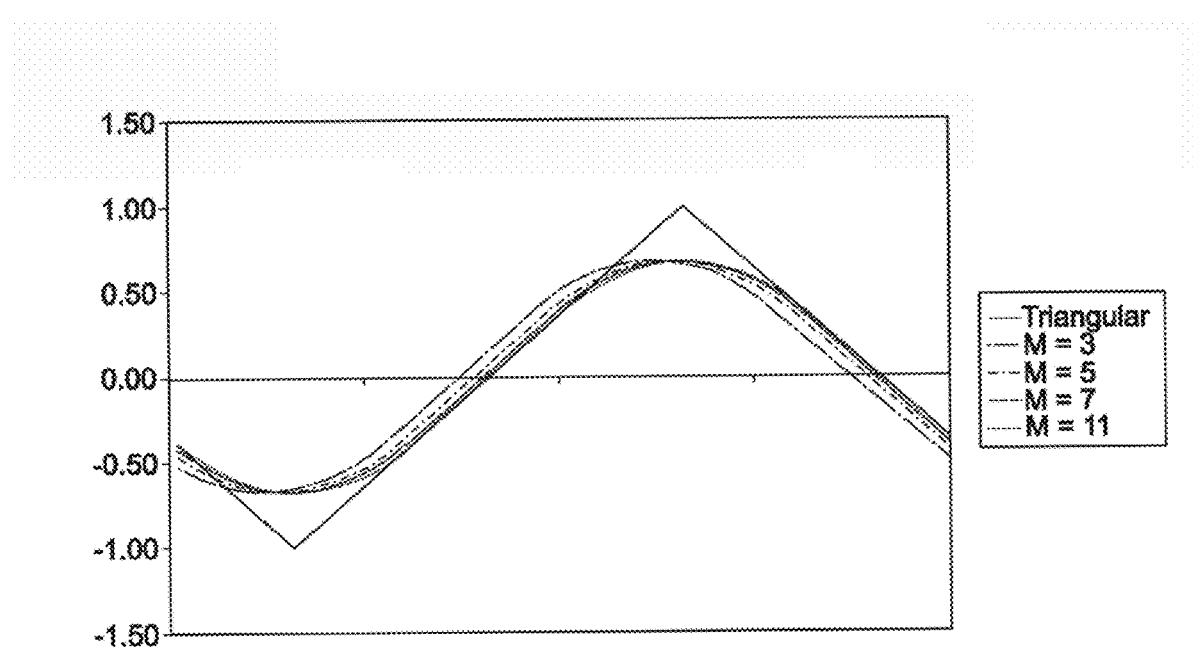
FIG. 9 shows various output signals generated from triangular input waveforms for values of M ranging between 3 and 11.

FIG. 9 illustrates how the larger M becomes, the more faithfully the output signal generated mimics the desired sinusoidal output signal. As shown in FIG. 9 and in Table 1, THD is lowered substantially as M equals and exceeds 7.

According to one particularly efficacious embodiment, the distance g does not equal the distance d, the ratio of g/d equals 3M/(3M−1) when g is greater than d, the ratio of g/d equals 3M/(3M+1) when g is less than d, and M is an integer. In some embodiments, M ranges between 1 and 25. In preferred embodiments M is greater than 7, as discussed above.

Figure 10:
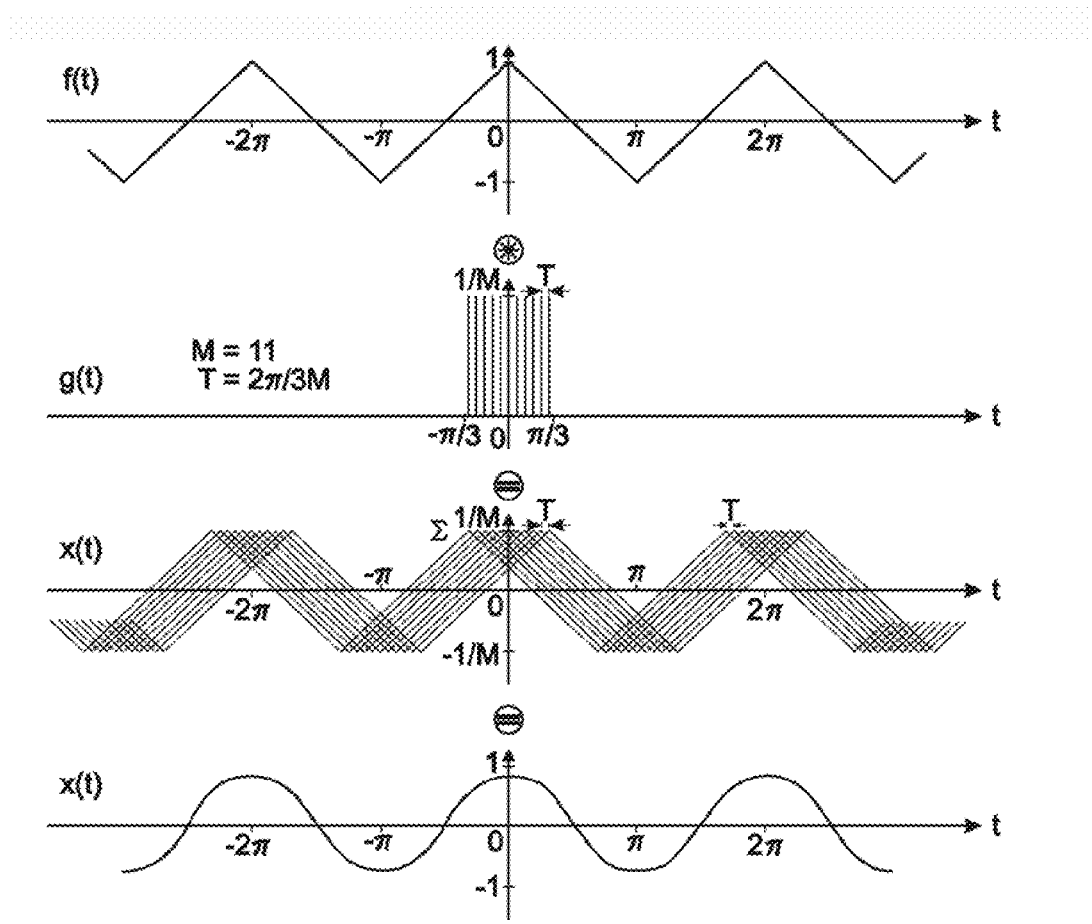
FIG. 10 shows time domain representations of triangular input signal f(t), impulse signals g(t), individual triangular signals x(t) resulting from convolving f(t) with g(t), and sinusoidal output signal x(t) resulting from summing individual triangular signals.
Figure 11:
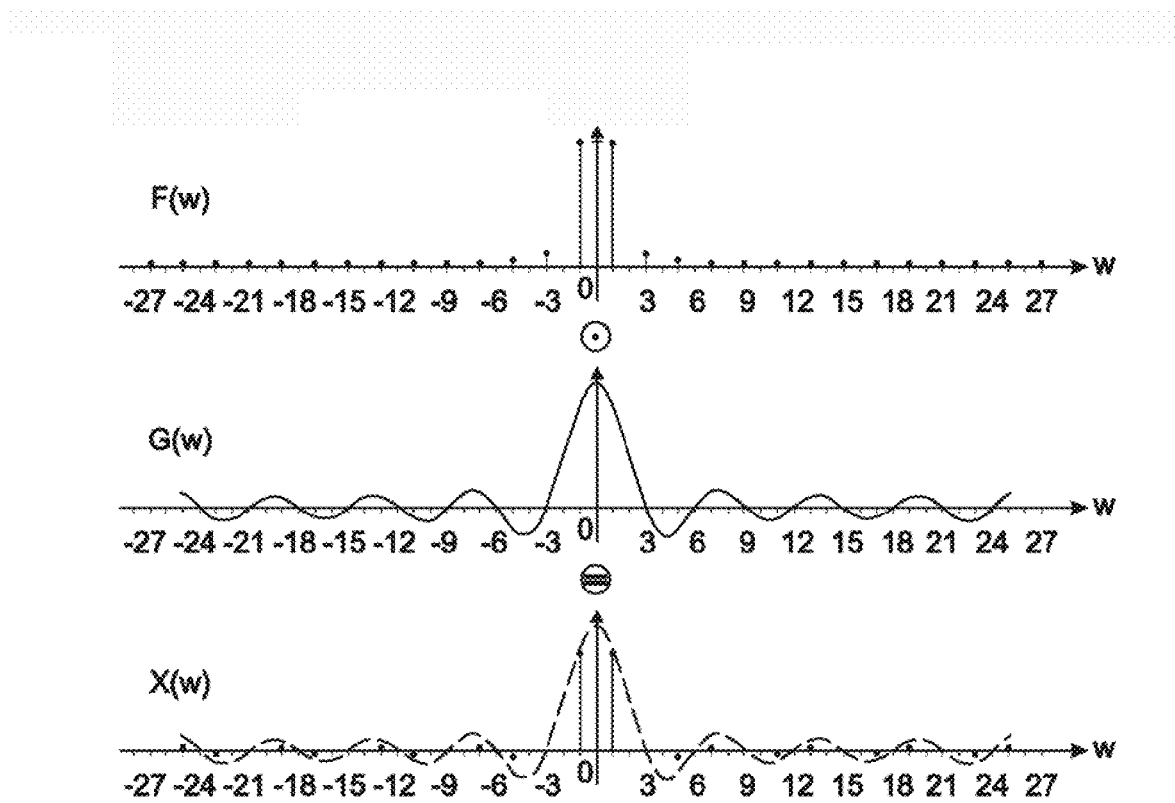
FIG. 11 shows frequency domain signals F(w), G(w) and X(w) corresponding to time domain signals f(t), g(t) and x(t) of FIG. 10.

Mathematically, the moving average operation is a convolution of the input signal with a discrete rectangular window function, or $$x(t)=f(t)*g(t)$$    (eq. 3)

where f(t) is the input signal (a triangular waveform), g(t) is the moving average function (a discrete rectangular window), x(t) is the sinusoidal output signal, and * denotes a convolution operator. The time domain functions and their Fourier transforms are summarized in Table 2 below. The time- and frequency-domain signals corresponding to f(t), g(t), x(t) and are shown from top to bottom, respectively, in FIGS. 10 and 11, where M equals 11.

TABLE 2

Time domain signals and their corresponding Fourier transforms for triangular input signals

| Function | Description | Time Domain $f(t) = \frac{1}{2\pi} \int_{-\infty}^{\infty} F(\omega)e^{j\omega t} d\omega$ | Frequency Domain $F(\omega) = \int_{-\infty}^{\infty} f(t)e^{-j\omega t} dt$ |
|---|---|---|---|
| Moving average function | Rectangular window function, length = M, amplitude = 1/M, width = 2π/3 | $g(t) = \sum_{n=-\frac{M-1}{2}}^{\frac{M-1}{2}} \frac{1}{M} \cdot \delta(t - nT)$ | $G(w) = \text{asinc}_M(wT) = \sin(w \cdot \pi/3)/M \cdot \sin(w \cdot \pi/3M)$ |
| Input signal | Periodic triangular signal, period = 2π, amplitude = 1 | $f(t) = [8/\pi^2][\cos(t) + (1/9) \cdot \cos(3t) + (1/25) \cdot \cos(5t) + (1/49) \cdot \cos(7t) + \ldots]$ | $F(w) = [8/\pi^2] \cdot (2\pi)^{1/2} [\delta(w-1) + \delta(w+1) + (1/9) \cdot \delta(w-3) + (1/9) \cdot \delta(w+3) + (1/25) \cdot (w-5) + (1/25) \cdot \delta(w+5) + (1/49) \cdot \delta(w-7) + (1/49) \cdot \delta(w+7) + \ldots]/2$ |
| Output signal | Moving average of the input signal | $x(t) = f(t)*g(t)$ $x(t) \sim \cos(t)$ | $X(w) = F(w) \cdot G(w)$ |

The periodic triangular input signal may be expressed as an even function by the Fourier cosine series $f(t)=[8/\pi^2][\cos(t)+(1/9)\cos(3t)+(1/25)\cos(5t)+(1/49)\cos(7t)\ldots]$. Only the first few terms are dominant harmonics. The desired output of the moving average filter of length M is the averaged sum of phase shifted input waveforms, as described by equation 1 above and by:

$$x(t) = \sum_{n=-\frac{M-1}{2}}^{\frac{M-1}{2}} f(t-nT)/M \quad \text{(eq. 4)}$$

Individual phase shifted signals can be described as a convolution of such signals with a discrete impulse function, where $f(t-nT)=f(t)*\delta(t-nT)$. Accordingly, $$\begin{aligned}x(t) &= \sum_{n=-\frac{M-1}{2}}^{\frac{M-1}{2}} [f(t)*\delta(t-nT)]/M \quad \text{(eq. 5)}\\ &= f(t) * \sum_{n=-\frac{M-1}{2}}^{\frac{M-1}{2}} \delta(t-nT)/M\\ &= f(t) * g(t)\\ &= \int_{-\infty}^{\infty} f(\tau) \cdot g(t-\tau)d\tau \text{ where}\end{aligned}$$

$$g(t) = \sum_{n=-\frac{M-1}{2}}^{\frac{M-1}{2}} \frac{1}{M} \cdot \delta(t-nT) \quad \text{(eq. 6)}$$

Consequently, the moving average function g(t) is a rectangular window of length M and amplitude 1/M, where M equals the number of photodetector elements corresponding to each of the phase shifted triangular waveforms.

The frequency response of the sinusoidal output signal can be evaluated using Fourier analysis. Convolution in the time domain corresponds to multiplication in the frequency domain, and therefore $X(w)=F(w)\cdot G(w)$. The Fourier transform of the triangular waveform x(t) is given by:

$$X(w)=[8/\pi^2]\cdot(2\pi)^{1/2}[\delta(w-1)+\delta(w+1)+(1/9)\cdot\delta(w-3)+$$
$$(1/9)\cdot\delta(w+3)+(1/25)\cdot\delta(w-5)+(1/25)\cdot\delta(w+5)+$$
$$(1/49)\cdot\delta(w-7)+(1/49)\cdot\delta(w+7)+\ldots]/2 \quad \text{(eq. 7)}$$

The Fourier transform of the discrete window function g(t) is derived as follows:

$$f(t-nT) \Leftrightarrow F(\omega)e^{-j\omega nT}$$
$$\delta(t-nT) \Leftrightarrow e^{-j\omega nT}$$

$$G(\omega) = \sum_{n=-\frac{M-1}{2}}^{\frac{M-1}{2}} \frac{1}{M} \cdot e^{-j\omega nT} \quad \text{(eq. 8)}$$

Applying the closed form expression for a geometric series:

$$\sum_{n=L}^{U} r^n = \frac{r^L - r^{U+1}}{1-r} \quad \text{(eq. 9)}$$

$$\begin{aligned}G(\omega) &= \frac{1}{M} \cdot \frac{e^{j\omega\frac{M-1}{2}\cdot T} - e^{-j\omega\frac{M+1}{2}\cdot T}}{1-e^{-j\omega T}}\\ &= \frac{1}{M} \cdot \frac{e^{-j\omega\frac{T}{2}}}{e^{-j\omega\frac{T}{2}}} \left[\frac{e^{j\omega\frac{MT}{2}} - e^{-j\omega\frac{MT}{2}}}{e^{j\omega\frac{T}{2}} - e^{-j\omega\frac{T}{2}}}\right]\\ &= \frac{\sin\left(M\frac{\omega T}{2}\right)}{M\cdot\sin\left(\frac{\omega T}{2}\right)}\\ &= \text{asinc}_M(\omega T)\end{aligned}$$

where $\text{asinc}_M(wT)$ is an aliased sinc function.

Replacing T with $2\pi/3M$, G(w) becomes $\sin(w\cdot\pi/3)M\cdot\sin(w\cdot\pi/3M)$. The zero-crossings of $\text{asinc}_M(wT)$ are at w=3, 6, 9, 12, etc.

An example of a moving average filter of length M=11 is shown below, where the coefficients for each term w in the frequency domain are calculated as follows:

$$G(w=1) = \sin(\pi/3)/11\cdot\sin(\pi/3\cdot 11) = 0.8282$$
$$G(w=3) = 0$$
$$G(w=5) = -0.1718$$
$$G(w=7) = 0.1274$$
$$G(w=9) = 0$$
$$\ldots$$

$$\begin{aligned}X(w) &= F(w)\cdot G(w) \quad \text{(eq. 10)}\\ &= [8/\pi^2]\cdot(2\pi)^{1/2}[(0.8282)\cdot\delta(w-1)+\\ &\quad (0.8282)\cdot\delta(w+1)+0+0+\\ &\quad (-0.1718)(1/25)\cdot\delta(w-5)+\\ &\quad (-0.1718)(1/25)\cdot\delta(w+5)+\\ &\quad (0.1274)(1/49)\cdot\delta(w-7)+\\ &\quad (0.1274)(1/49)\cdot\delta(w+7)+0+\\ &\quad 0+\ldots]/2\\ &= (2\pi)^{1/2}[(0.6713)\cdot\delta(w-1)+(0.6713)\cdot\\ &\quad \delta(w+1)+(-0.0056)\cdot\delta(w-5)+\\ &\quad (-0.0056)\cdot\delta(w+5)+(0.0021)\cdot\\ &\quad \delta(w-7)+(0.0021)\cdot\delta(w+7)+\ldots]/2\end{aligned}$$

As intended, the dominant 3rd harmonic frequency component (w=3) is totally suppressed, leaving the fundamental frequency (w=1) and small fractions of the higher harmonics. Taking the inverse Fourier transform:

$$\begin{aligned}x(t) &= \frac{1}{2\pi}\int_{-\infty}^{\infty} X(\omega)e^{j\omega t} d\omega\\ &= (0.6713)\cdot\cos(t)+(-0.0056)\cdot\cos(5t)+(0.0021)\cdot\\ &\quad \cos(7t)+\ldots\end{aligned}$$

The quality of the signal can be evaluated by calculating the total harmonic distortion:

$$\begin{aligned}\%THD &= \frac{\sqrt{H_2^2+H_3^2+\ldots+H_N^2}}{\sqrt{H_1^2+H_2^2+H_3^2+\ldots+H_N^2}} \times 100 \quad \text{(eq. 11)}\\ &= 100\times[(-0.0056)^2+(0.0021)^2]^{1/2}/\\ &\quad [(0.6713)^2+(-0.0056)^2+(0.0021)^2]^{1/2}\\ &= 0.9\%\end{aligned}$$

From the foregoing analysis we conclude that the output signal approaches x(t)~(0.67)·cos(t) with minimal total harmonic distortion.

Figure 12:
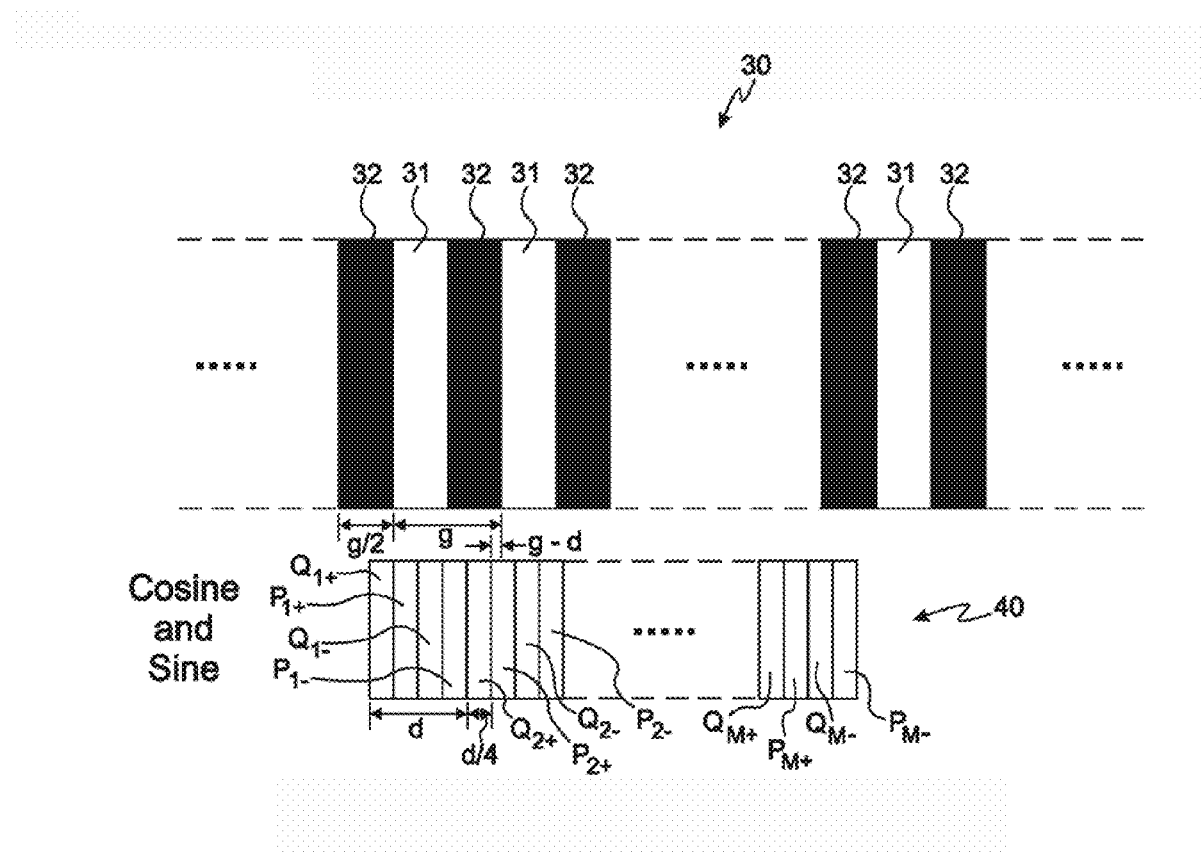
FIG. 12 shows one embodiment of light detectors 40 and code wheel or code strip 30 configured to produce trapezoidal output signals.

Referring now to FIGS. 5 and 12 through 15, there is now described another embodiment where trapezoidal output signals are generated in front-end analog circuitry 110. In FIGS. 5 and 12, it will be seen that light detector 40 comprises a set of light detecting elements 41, 42, 43 and 44, where each light detecting element comprises a pair of complementary light detectors $P_{1+}$, $P_{1-}$, . . . , $P_{M+}$, $P_{M-}$ spaced apart from one another and arranged substantially parallel to the axis of movement, and configured to provide output signals employed in analog front-end circuit 110 to form cosine output signal x(t). Note that FIG. 5 does not show the light detecting elements configured to provide output signals employed in analog front-end circuit 110 to form sine output signal y(t), where each light detecting element comprises a pair of complementary light detectors $Q_{1+}$, $Q_{1-}$, . . . , $Q_{M+}$, $Q_{M-}$ spaced apart from one another and arranged substantially parallel to the axis of movement. In one embodiment where trapezoidal output signals are provided by differential amplifiers 91, 92, 93 and 94, and as shown in FIG. 12, each of light detectors $P_{1+}$, $P_{1-}$, . . . , $P_{M+}$, $P_{M-}$ in each pair has a width d/4, and each of light detecting elements 41, 42, 43 and 44 has a width 3d/4. Light detecting elements 41, 42, 43 and 44 are spaced apart from one another and separated by corresponding pairs of light detectors $Q_{1+}$, $Q_{1-}$, . . . , $Q_{M+}$, $Q_{M-}$ (which are also spaced apart from one another). Both sets of light detecting elements are arranged substantially parallel to the axis of movement and substantially parallel to the axis of movement coinciding with directions of movement 111 and 112 of code strip or code wheel 30. As further shown in FIG. 12, portions of light beam 26 project through optically transmissive sections 31a-31f to sweep across the sets of light detecting elements 41, 42, 43 and 44 as code strip or code wheel 30 moves along the axis of movement. In a preferred embodiment, the phase shift T between adjoining light detector elements equals 2π/3M.

According to the embodiment illustrated in FIGS. 5 and 12, the distance g does not equal the distance d, the ratio g/d equals 3M/(3M−1) when g is greater than d, the ratio g/d equals 3M/(3M+1) when g is less than d, and M is an integer. In some embodiments, M ranges between 1 and 25. In preferred embodiments M is greater than 7, more about which is said below. The dimensions of the photodetector elements in light detector circuit 40 and code wheel or code strip 30 are shown in FIG. 12, where the code wheel or code strip grating pitch equals g, the combined photodetector element width equals d, and the separation between sine and cosine channel equals d/4 to yield a phase shift of π/2.

Referring now to FIG. 5, output signals provided by light detectors 41 ($P_{1+}$, $P_{1-}$), 42 ($P_{2+}$, $P_{2-}$), 43 ($P_{(M-1)+}$, $P_{(M-1)-}$), and 44 ($P_{M+}$, $P_{M-}$) in each pair of complementary light detectors in light detector circuit 40 are provided to corresponding pairs of first and second amplifiers 81, 82, 83 and 84 in amplifier circuit 80. The respective outputs generated by the first and second amplifiers for each pair of complementary light detectors 81, 82, 83 and 84 are provided to corresponding respective differential amplifiers 91, 92, 93 and 94. Differential amplifiers 91, 92, 93 and 94 combine the differential signals of each of the complementary pairs of light detectors. Moreover, each of differential amplifiers 91, 92, 93 and 94 provides an output signal having a trapezoidal shape. Next, an output cosine signal x(t) is produced by summing amplifier 100 by taking the average output of all the individual elements as follows:

$$x(t)=[f_1+f_2+f_3+ \ldots +f_{M-1}+f_M]/M \qquad (eq. 1)$$

Output signal x(t) is characterized by its very high fidelity, accuracy and low total harmonic distortion ("THD"), and may therefore be used to generate high-resolution interpolated output signals. Thus, the raw signals of a rotary or linear incremental encoder 10 are employed in one embodiment to form trapezoidal waveforms, which in turn are combined using spatial averaging techniques to produce a highly accurate and almost purely sinusoidal output signal having a well-defined waveform morphology, phase, amplitude and frequency.

Note that FIG. 5 illustrates the cosine portion only of encoder 10. Typically, encoder 10 contains both sine and cosine light-detecting circuitry portions that are configured to provide cosine and sine output signals 90 degrees out of phase with respect to one another. See FIG. 12, where both cosine and sine portions of light detector circuit 40 are shown.

Continuing to refer to FIGS. 5 and 12, and as discussed above, light incident on the incremental window and bar patterns of code wheel or code strip 30 is modulated by photodetector elements 41, 42, 43 and 44 and the circuitry associated therewith to provide output signals that are trapezoidally shaped. To create the effect of a moving average filter, multiple phase shifted copies of a trapezoidal waveform are created by intentionally mismatching the dimensions of the grating pitch and the widths of photodetector elements 41, 42, 43 and 44. Instead of taking the moving average of the signals over time, the signals are averaged spatially across photodetector elements 41, 42, 43 and 44, where each signal has a constant phase shift T with respect to signals generated by adjoining photodetector elements.

Note that the number of apertures or optically transmissive sections 31a-31f, the number of optically opaque sections 32a-32e, and the number of photodetector elements 41, 42, 43 and 44 shown in FIGS. 5 and 12 are merely illustrative. Any suitable number or arrangement of such optical encoder components may be employed according to the particular application and the particular design and cost constraints at hand.

Output signals x(t) and y(t) generated by analog front-end circuitry 110 are processed in a manner similar to that described above in connection with FIGS. 7 and 8 to provide interpolated digital output signals A(t) and B(t). As in the case of triangular waveforms, the optimal averaging window has been found to be equal to 2π/3, which produces a sinusoidal output signal x(t) or y(t) with the lowest total harmonic distortion (or THD). That is, averaging is done over precisely ⅓ of the signal period, where the phase shift between signals is T=2π/3M. Thus, the ratio g/d=3M/(3M−1). It is preferred that M be greater than 7 so that a sufficiently large number of photodetectors are employed to provide the degree of smoothing required to generate a precise sinusoidal output signal. As M increases, the resulting sinusoidal output signal has ever lower total harmonic distortion ("THD").

Figure 13:
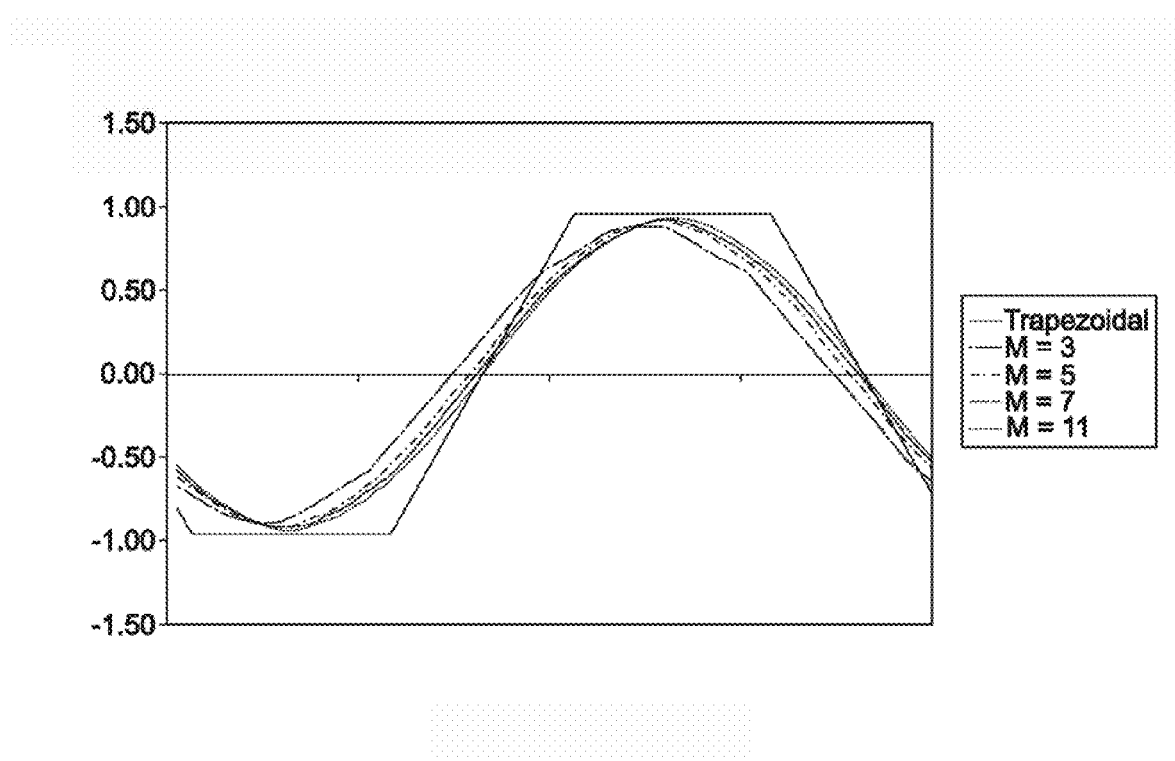
FIG. 13 shows various output signals generated from trapezoidal input waveforms for values of M ranging between 3 and 11.
Figure 14:
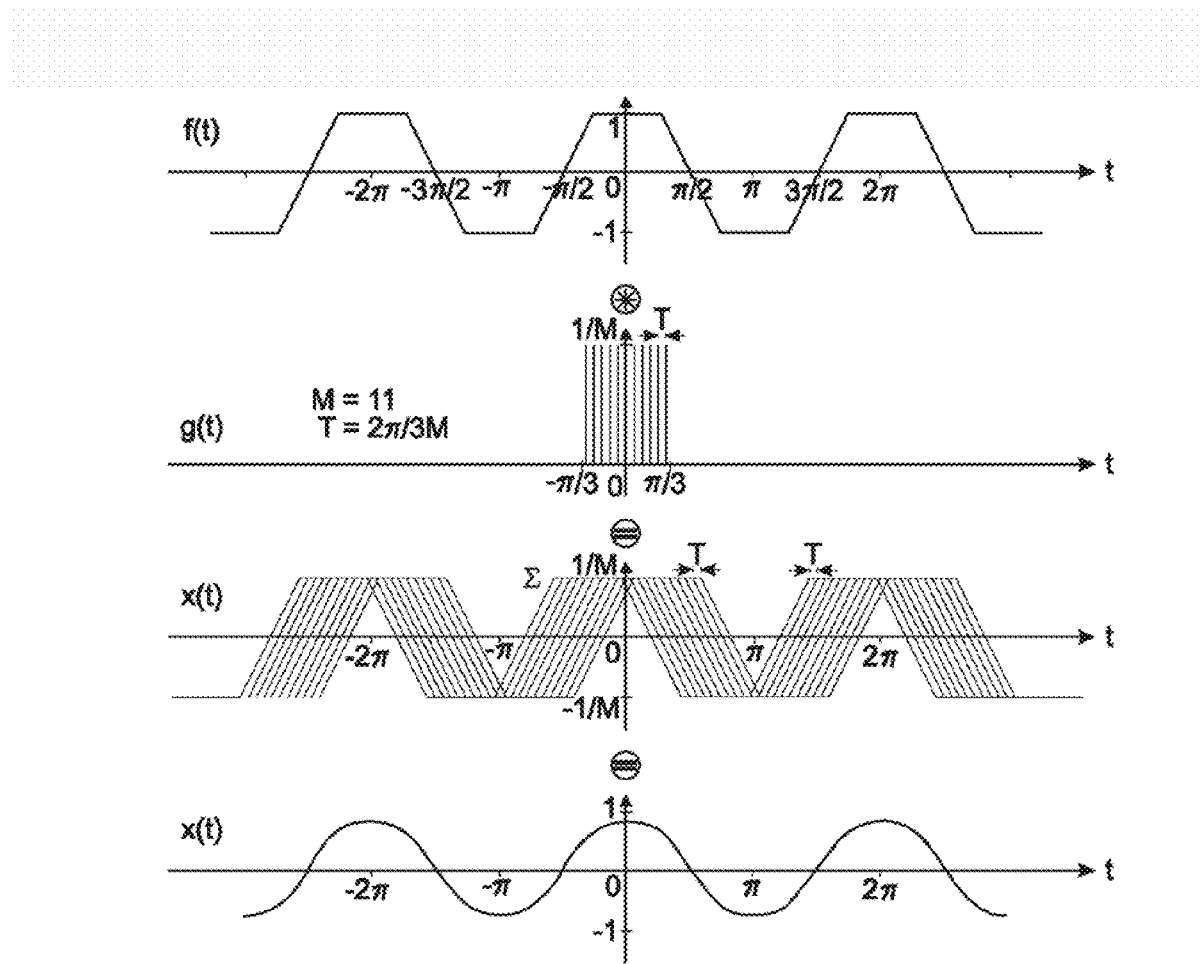
FIG. 14 shows time domain representations of trapezoidal input signal f(t), impulse signals g(t), individual trapezoidal signals x(t) resulting from convolving f(t) with g(t), and sinusoidal output signal x(t) resulting from summing individual trapezoidal signals.
Figure 15:
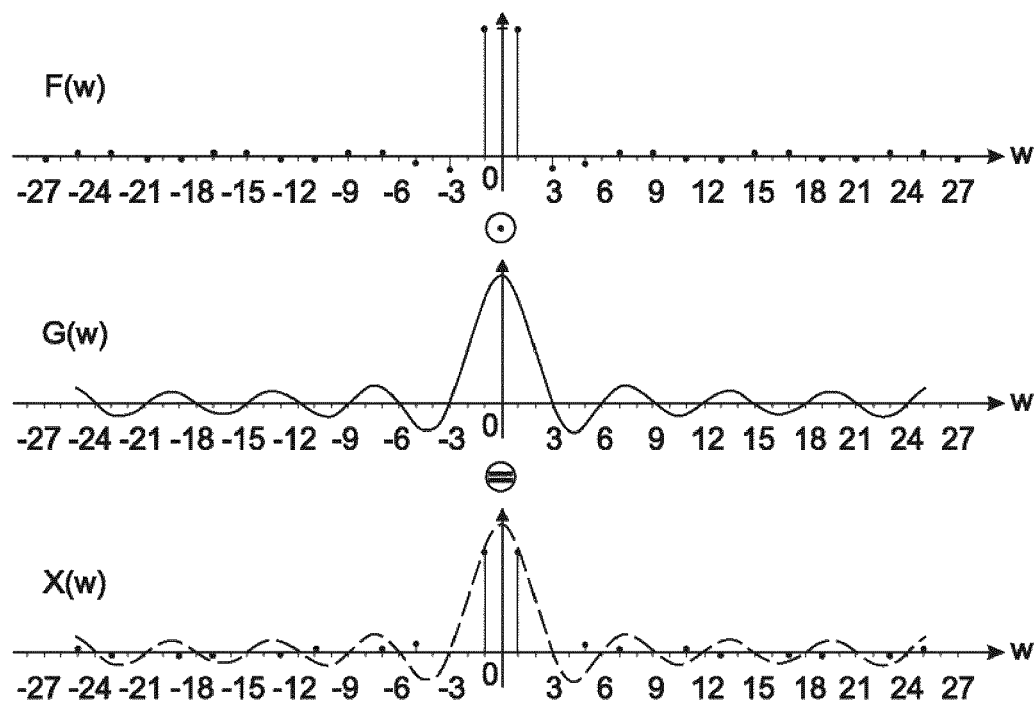
FIG. 15 shows frequency domain signals F(w), G(w) and X(w) corresponding to time domain signals f(t), g(t) and x(t) of FIG. 14.

Referring to FIG. 13, it will be seen that THD decreases as M increases. FIG. 13 illustrates how the larger M becomes, the more faithfully the output signal generated mimics the desired sinusoidal output signal. As shown in FIG. 13, THD is lowered substantially as M equals and exceeds 7.

As in the case of triangular waveforms, mathematically the moving average operation is a convolution of the input signal with a discrete rectangular window function, or $$x(t)=f(t)*g(t) \qquad (eq. 3)$$

where f(t) is the input signal (a trapezoidal waveform), g(t) is the moving average function (a discrete rectangular window), x(t) is the sinusoidal output signal, and * denotes a convolution operator. The time domain functions and their Fourier transforms corresponding to trapezoidal waveforms are summarized in Table 3 below. The time- and frequency-domain signals corresponding to f(t), g(t), x(t) and are shown from top to bottom, respectively, in FIGS. 14 and 15, where M equals 11. Those skilled in the art will appreciate that the calculations set forth above respecting the generation and use of triangular input signals are sufficient for purposes of grasping the subject matter at hand, and therefore need not be repeated here for trapezoidal input signals.

TABLE 3

Time domain signals and their corresponding Fourier transforms for trapezoidal input signals

| Function | Description | Time Domain $f(t) = \frac{1}{2\pi}\int_{-\infty}^{\infty} F(\omega)e^{j\omega t} d\omega$ | Frequency Domain $F(\omega) = \int_{-\infty}^{\infty} f(t)e^{-j\omega t} dt$ |
|---|---|---|---|
| Moving average function | Rectangular window function, length = M, amplitude = 1/M, width = $2\pi/3$ | $g(t) = \sum_{n=-\frac{M-1}{2}}^{\frac{M-1}{2}} \frac{1}{M} \cdot \delta(t-nT)$ | $G(w) = \mathrm{asinc}_M(wT) = \sin(w \cdot \pi/3)/M \cdot \sin(w \cdot \pi/3M)$ |
| Input signal | Periodic trapezoidal signal, period = $2\pi$, amplitude = 1 | $f(t) = [8(2)^{1/2}/\pi^2][\cos(t) - (1/9) \cdot \cos(3t) - (1/25) \cdot \cos(5t) + (1/49) \cdot \cos(7t) + \ldots]$ | $F(w) = [8(2)^{1/2}/\pi^2] \cdot (2\pi)^{1/2} [\delta(w-1) + \delta(w+1) - (1/9) \cdot \delta(w-3) - (1/9) \cdot \delta(w+3) - (1/25) \cdot \delta(w-5) - (1/25) \cdot \delta(w+5) + (1/49) \cdot \delta(w-7) + (1/49) \cdot \delta(w+7) + \ldots]/2$ |
| Output signal | Moving average of the input signal | $x(t) = f(t)*g(t)$ $x(t)\sim\cos(t)$ | $X(w) = F(w) \cdot G(w)$ |

Some of the various embodiments presented herein have certain advantages and features, including the ability to be implemented using standard CMOS or BiCMOS manufacturing processes, the ability to be implemented with relative ease and design simplicity, the ability to be implemented in both incremental and absolute motion encoders, and the ability to provide high interpolation factors without sacrificing timing accuracy.

Included within the scope of the present invention are methods of making and having made the various components, devices and systems described herein.

Various embodiments of the invention are contemplated in addition to those disclosed hereinabove. The above-described embodiments should be considered as examples of the present invention, rather than as limiting the scope of the present invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

I claim:

1. An optical encoder, comprising:
   (a) a light emitter configured to emit a beam of light therefrom;
   (b) a code strip or code wheel configured to move along an axis of movement and comprising a plurality of alternating optically opaque and optically transmissive sections disposed along the axis, each of the optically opaque and optically transmissive sections having a width g/2, the optically transmissive sections being spaced apart from one another by a distance g/2, and
   (c) a light detector comprising a set of light detecting elements, each light detecting element comprising a pair of complementary light detectors arranged substantially parallel to the axis of movement, each light detector in each pair having a width d/2 or d/4, each light detecting element having a width d or 3d/4, the light detecting elements being arranged substantially parallel to the axis of movement;

wherein the light beam shines upon the code strip or code wheel, portions of the light beam project through the optically transmissive sections to sweep across the set of light detecting elements as the code strip or code wheel moves along the axis of movement, g does not equal d, the ratio g/d equals 3M/(3M−1) when g is greater than d, the ratio g/d equals 3M/(3M+1) when g is less than d, and M is an integer.

2. The optical encoder of claim 1, wherein the optically transmissive sections are apertures.

3. The optical encoder of claim 1, wherein the optically opaque sections are reflective.

4. The optical encoder of claim 1, further comprising a collimating lens disposed between the light emitter and the code strip or code wheel.

5. The optical encoder of claim 1, wherein output signals provided by light detectors in each pair of complementary light detectors are provided to first and second amplifiers.

6. The optical encoder of claim 5, wherein outputs from the first and second amplifiers for each pair of complementary light detectors are provided to a corresponding differential amplifier.

7. The optical encoder of claim 6, wherein each light detector in each pair has a width d/2, each light detecting element has a width d, and each differential amplifier provides an output signal having a triangular shape.

8. The optical encoder of claim 6, wherein each light detector in each pair has a width d/4, each light detecting element has a width 3d/4, and each differential amplifier provides an output signal having a trapezoidal shape.

9. The optical encoder of claim 7 or claim 8, wherein the outputs from the differential amplifiers are summed in a summing amplifier to produce a cosine output signal x(t) or a sine output signal y(t).

10. The optical encoder of claim 9, wherein the output signal (x(t) or (y(t)) is provided to an interpolator circuit.

11. The optical encoder of claim 10, wherein the interpolator circuit is configured to yield at least one digitally interpolated output signal therefrom.

12. The optical encoder of claim 11, wherein the at least one digitally interpolated output signal has a corresponding frequency that is an integer multiple of a frequency of the output signal x(t) or y(t).

13. The optical encoder of claim 1, wherein M ranges between 1 and 25.

14. The optical encoder of claim 1, wherein the phase shift T between adjoining light detector elements equals $2\pi/3M$.

15. A method of generating a sinusoidal signal with an optical encoder, comprising:
(a) emitting a beam of light from a light emitter;
(b) moving a code strip or code wheel along an axis of movement through the beam of light, the code strip or code wheel comprising a plurality of optically transmissive sections disposed along the axis, each optically transmissive section having a width g/2, the optically transmissive sections being spaced apart from one another by a distance g/2;
(c) sweeping portions of the light beam projecting through the optically transmissive sections across a set of light detecting elements as the code strip or code wheel moves along the axis of movement, and
(d) detecting the portions of the light beam with the set of light detecting elements, each light detecting element comprising a pair of complementary light detectors arranged substantially parallel to the axis of movement, each light detector in each pair having a width d/2 or d/4, each light detecting element having a width d or 3d/4, the light detecting elements being arranged substantially parallel to the axis of movement;

wherein g does not equal d, the ratio g/d equals 3M/(3M−1) when g is greater than d, the ratio g/d equals 3M/(3M+1) when g is less than d, and M is an integer.

16. The method of claim 15, further comprising providing output signals from the light detectors in each pair of complementary light detectors to first and second amplifiers.

17. The method of claim 16, further comprising providing outputs from each of the first and second amplifiers to a corresponding differential amplifier.

18. The method of claim 17, further comprising each of the differential amplifiers providing an output signal having a triangular shape when each light detector in each pair has a width d/2 and each light detecting element has a width d.

19. The method of claim 17, further comprising each of the differential amplifiers providing an output signal having a trapezoidal shape when the light detector in each pair has a width d/4 and each light detecting element has a width 3d/4.

20. The method of claim 18 or claim 19, further comprising summing, in a summing amplifier, the outputs from the differential amplifiers to produce a cosine output signal x(t) or a sine output signal y(t).

21. The method of claim 20, wherein the output signal x(t) or y(t) is provided to an interpolator circuit.

22. The method of claim 21, wherein the interpolator circuit is configured to yield at least one digitally interpolated output signal therefrom.

23. The method of claim 22, wherein the at least one digitally interpolated output signal has a corresponding frequency that is an integer multiple of a frequency of the output signal x(t) or y(t).

24. The method of claim 15, wherein M ranges between 1 and 25.

* * * * *